United States Patent [19]

Thorn

[11] Patent Number: 5,206,588

[45] Date of Patent: Apr. 27, 1993

[54] APPARATUS AND PROCESS FOR THE NON-DESTRUCTIVE MEASUREMENT OF THE OHMIC RESISTANCE OF A THIN LAYER USING EDDY CURRENTS

[75] Inventor: Gernot Thorn, Hanau, Fed. Rep. of Germany

[73] Assignee: Leybold Aktiengesellschaft, Hanau, Fed. Rep. of Germany

[21] Appl. No.: 345,037

[22] Filed: Apr. 27, 1989

[30] Foreign Application Priority Data

Apr. 30, 1988 [DE]  Fed. Rep. of Germany ....... 3815009

[51] Int. Cl.$^5$ ............. G01B 7/10; G01R 33/12; G01R 35/00; G01N 27/72
[52] U.S. Cl. ................... 324/230; 324/202; 324/236
[58] Field of Search .............. 324/229–231, 324/225, 226, 202, 233, 262, 236, 237, 238

[56] References Cited

U.S. PATENT DOCUMENTS

| | | | |
|---|---|---|---|
| 2,809,346 | 10/1957 | Archer | 324/229 |
| 4,005,359 | 1/1977 | Smoot | 324/230 |
| 4,105,105 | 8/1978 | Braum | 324/236 |
| 4,187,462 | 2/1980 | Haker et al. | 324/236 |
| 4,365,196 | 12/1982 | Finch | 324/202 |
| 4,682,105 | 7/1987 | Thorn | 324/230 |

Primary Examiner—Walter E. Snow
Attorney, Agent, or Firm—Koda and Androlia

[57] ABSTRACT

The invention concerns apparatus and a process for the non-destructive measurement of the ohmic resistance of thin layers according to the eddy-current principle. Here an inductor (2) is fed with a high frequency voltage ($U_{osz}$) and the magnetic field of this inductor (2) is directed at the thin layer to be measured, whereby an eddy current flows in this layer the magnetic field of which weakens the magnetic field of the inductor (2). The inductor (2) is here part of an oscillating circuit (3) which is held always at resonance by means of a phase-correcting arrangement (14). Under these resonance conditions the reactive values of the oscillating circuit (3) may be neglected so that the current flowing into the oscillating circuit (3) depends solely on the ohmic resistance of this oscillating circuit (3), which in turn is determined by the ohmic resistance of the layer to be measured.

22 Claims, 4 Drawing Sheets

APPARATUS AND PROCESS FOR THE NON-DESTRUCTIVE MEASUREMENT OF THE OHMIC RESISTANCE OF A THIN LAYER USING EDDY CURRENTS

The invention concerns apparatus and process for the non-destructive measurement of the ohmic resistance of thin layers according to the eddy current principle.

One problem in the measurement of the properties of thin layers consists in that these layers may be damaged or destroyed in the measurement process by touching or electrical contacting. It is particularly inconvenient when during measurement of the electrical resistance of a thin layer this layer is pressed through, scratched or contaminated.

Several measurement processes have already been developed to avoid these disadvantages, using sensors operating in a contactless manner. Thus e.g. from German Utility Model 68 10 362 a capacitatively functioning device for measuring the layer thickness of a metallic coating on a web of insulating material is known. In this device rotatably rollers serve to guide the web of insulating material and simultaneously to measure the conductivity of its metallic coating, the rollers functioning as capacitor plates for capacitatively coupling an ohmmeter.

In a further known measurement process, DE-A-3 335 766, a guide roller and several sensors with locally restricted measurement ranges are used for the electrical measurement of layer thicknesses on running strips in vacuum coating plants. Here the sensors are distributed over the surface of the guide roller and connected via transmission device to an analysing circuit.

Beside these capacitive processes suited mainly for measuring the resistance of high-impedance layers, inductive processes have also been proposed which are more suited for measuring the resistance of low-impedance layers. For instance, from DE-A-2 345 849 an arrangement is known for the contactless measurement of the thickness of electrically conductive layers, wherein an induction coil with an alternating voltage generator and a measuring device for determining the value of the inductance of the induction coil are provided. Herein the induction coil is arranged opposite a second, likewise constructed induction coil with an air gap left between them. The directions of current flow are the same in both coils and their output signals are applied additively to the measuring device.

Furthermore, a process is known for the non-destructive measurement of the individual thicknesses of layer systems based on the eddy current process, wherein measuring probes with a complex impedance are used; both the real and imaginary components may each contain data concerning two layers of the layer systems to be measured (A. Ott: 'Zerstörungsfreie Messung der Einzeldicken von Schichtsystemen nach dem Wirbelstrom-Vwerfahren', ['Non-destructive measurement of the individual thicknesses of layer systems '] Zeitschrift für Werkstofftechnik, Volume 6, 1975, pages 188 to 194). A disadvantage of this known measuring apparatus consists in that only relatively thick layers, e.g. of 1 µm to 1000 µm of aluminium, can be measured and that it is not very sensitive.

Further, a process is known from DE-A-2 636 999 for the contactless measurement of the specific electric conductivity of a platelet, wherein a tuned circuit sensor in the form of a tuning-fork pick-up and field commutation takes place by way of ferrite cores. However, this process is not suitable for measurements at larger surfaces.

In another process (DE-B-1 301 858) for the electrodeless determination of the specific electric conductivity of a test object with the aid of a resonant circuit consisting of a coil and a capacitor, the power carried by this resonant circuit in the presence and absence of this test object is determined, wherein the test object is moved in the field of the coil and capacitor, preferably sequentially in the field of the coil and of the capacitor. However, this process is also not suited for measurements at large probe surfaces because the probes must either be pulled through the coil of the resonant circuit or passed past the capacitor.

In a known eddy current testing appliance a coil is coupled to a test object in order to induce eddy currents in the latter, whereby in turn to induce voltages in this coil (DE-A-3 022 078). This eddy current measuring appliance operates at various frequencies so that the sensor has no resonant circuit and no frequency adjustment.

Finally, from (East German) DD-B-224 946 another eddy current measuring process is known, wherein an oscillating circuit is applied, consisting of a test coil and a capacitor and wherein the frequency of a voltage-controlled oscillator is regulated until resonance is attained. However, because of its sensitivity this measurement process is restricted to laboratory applications where it is feasible to adjust the zero point and the calibration.

The underlying aim of the invention is to provide an eddy current sensor of the above type which is suitable for industrial application, e.g. in strip coating plants.

The advantage achieved by the invention consists in particular in that in measurements in vacuum plants which are not opened for e.g. 8 hours, practically no inaccuracies arise over the whole time interval. In addition, the inductively operating apparatus can work together with an analysing circuit which is also suitable for capacitatively operating measuring devices. In this way it becomes possible to evaluate the electrical resistance of high- and low-impedance layers via capacitative and inductive measuring devices by means of the same analysing circuit. The measured value of resistance relates as a rule to a rectangular or square surface. On the hypothesis that the layer to be measured is metallically dense and the usual solid-state values are valid, e.g. the specific resistance, from the measured area resistance inferences can always be made concerning the thickness a, for which then the equation $$a = K \frac{1}{R_{area}}$$

is valid.

A preferred embodiment of the invention is illustrated in the drawings and will be described in what follows, in which.

Figure 1:
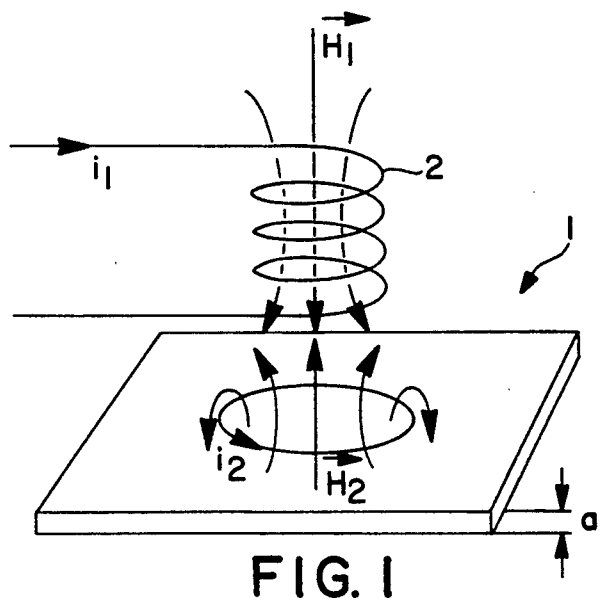
FIG. 1 is a representation in principle of an inductive sensor for the measurement of a low impedance surface resistance.

In FIG. 1 the principle of determining the resistance value of a thin layer 1 is illustrated. In what follows, by 'thin layer' all thin layers are to be understood which consist of no more than 3 to 5 atomic layers. For aluminium the measurement range moves between e.g. 1 nm and 1 μm. An AC current $i_1$ flows through a coil 2 located above the layer 1. Due to this current $i_1$ an alternating magnetic field $\vec{H}_1$ forms in the interior of the coil and causes an eddy current $i_2$ in the thin layer 1, which in turn produces a magnetic field $\vec{H}_2$ which weakens. (opposes) the magnetic field $\vec{H}_1$. One speaks here of a field compression (I. Küpfmüller: Einführung in die theroetische Elektrotechnik, [Introduction to theoretical electrical technology] 11th edition, p. 304 et seq.). The extent of the weakening of the magnetic field $\vec{H}_1$ allows an inference to be made about the surface resistance R☐ of the layer 1. The functional relationship between the current $i_1$ and the resistance R☐ of the layer is, to a first approximation, $$i_1 \sim \frac{1}{R}$$

It is here assumed that in the layers to be measured one is concerned with layers of very small thickness a relative to the so-called penetration depth (skin depth) δ, where $$\delta = \sqrt{\frac{2}{\omega\mu\lambda}}$$

(ω=circuit frequency, μ=permeability, λ=conductivity).

Figure 2:
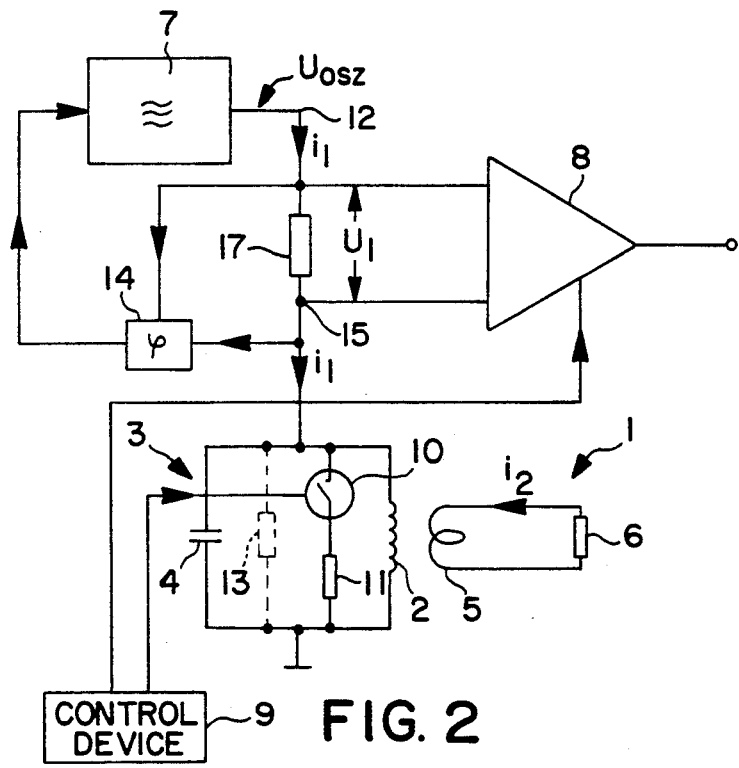
FIG. 2 shows a circuit arrangement for measuring a surface resistance.

A circuit arrangement by means of which the surface resistance may be calculated in a simple manner is illustrated in FIG. 2.

The coil 2 serving as measuring probe is here part of a parallel-tuned circuit 3 in which a capacitor 4 is disposed. The thin layer 1 to be measured in represented in an equivalent circuit as a coil 5 with a winding parallel to an ohmic resistance 6. The parallel-tuned circuit is coupled to an oscillator 7 which oscillates at a frequency of e.g. 1.8 MHz and the output voltage $U_{osz}$ of which is constant. The coupling ensues here over a resistor 17 serving as a sensor for the current $i_1$, and the voltage drop across it is passed to a preamplifier 8. The phase drift arising between the oscillator and the parallel-tuned circuit 3 is fed back to the oscillator 7 via a phase-correcting arrangement 14 which regulates to cosφ=1 corresponding to φ=0. Thus the phase-correcting arrangement 14 regulates the phase difference between $U_{osz}$ and $U_{sensor}$ to zero, i.e. regulates cosφ of the load to 1. The reference voltage, for which φ=0, is at point 12. Without correction, φ would at point 15 be ≠0. By virtue of the correction, however, the coil 2 and the capacitor 4 may be left out of consideration. When the parallel-tuned circuit 3 is in resonance, all the reactive elements are compensated and the high-frequency voltage of the sensor has the same phase angle as the voltage $U_{osz}$. Under this stipulation, the resistance R☐ of the thin layer 1 is transformed into a pure ohmic resistance 13 in the parallel-tuned circuit 3, because the air-gap coupled coils 2, 5 form a transformed.

Parallel to the coil 2 a calibrating resistor 11 may be connected via an external control device 9 and a switch 10. On receiving a calibration command the calibration resistor 11 simulating a normal load is connected. The control device 9 also controls the preamplifier 8 and adjusts the gain of the latter in a stepwise manner. Together with a fine adjuster located in the evaluator, a display to a calibration point is then set. In this way the arrangement before the coil 2 is calibrated up to the display at the output of the evaluator, i.e. the steepness has a defined value. The remotely controllable adjustment of the gain of the preamplifier 8 is therefore very important, in order that at high sensitivities the largest possible portion of the overall gain of the measuring system may be applied to the zero-compensated preamplifier 8. Otherwise the zero error would correspondingly be amplified with the measurement signal. More particularly, zero compensation takes place by eliminating the drift of the preamplifier 8 in the sensor and also the impedance drift of the coil 2 by zeroing and measuring. This ensues e.g. by the provision of two stores of which one stores a zero signal and the other a measurement signal, and the difference between the two signals serves as the measure for the resistance of the thin layer 1 to be measured.

The resistance values of a thin layer 1 that may be measured by the arrangement according to FIG. 2 lie preferably between 10 milliohm and 1 kilohm.

The current $i_1$ flowing through resistor 17 at resonance of the parallel-tuned circuit 3 is determined by the ohmic resistance value resulting from the transformation of the resistance R☐ (=6) in the paralleltuned circuit 3, i.e. the voltage $U_1$ arising at the input of the preamplifier 8 is given by $R_{17} \times i_1$, where $$i_1 = \frac{U_{osz}}{R_{17} + R_{13}||R_{16}}$$

Figure 3:
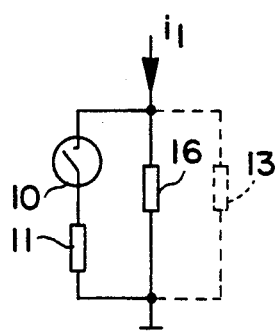
FIG. 3 shows an oscillating circuit at resonance contained in the circuit arrangement according to FIG. 2.

$R_{16}$ designating here the loss resistance of the circuit, shown in FIG. 3; and $R_{13} || R_{16}$ representing the resultant resistance of the parallel connection of $R_{13}$ and $R_{16}$, i.e. $R_{13} \times R_{16}/(R_{13}+R_{16})$.

$R_{17}$ and $R_{16}$ are constant while $R_{13}$ is variable, in particular between an infinite resistance on 'zeroing' and a value of K×R☐ during measurement. Since $R_{13} >> R_{17}$, the voltage $U_{osz}$ applied to the circuit is practically constant, so $$\Delta i_1 \sim \frac{1}{\Delta R_{13}}$$

Thus the current is inversely proportional to $R_{13}$. Since the preamplifier 8 draws a known voltage $U_{1(0)}$ from the actually measured voltage $U_1$, one obtains:

$$\Delta U = i_1 \times R_{13},$$

from which $$R_{13} = \frac{\Delta U}{i_1}$$

In practice, as experiments have shown, $R_{13}$ is approximately 11,000 times greater than $R_6$ in the described arrangement. If therefore $R_{13}$ is measured as to 110Ω, this means that the surface resistance of the thin layer 1 amounts to about 10 milliohm; if in contrast it is measured as 11MΩ, the surface resistance R□ or 6 of the thin layer 1 is about 1 KΩ.

FIG. 3 represents the equivalent circuit of the tuned circuit 3 in the resonance condition. The reference number 16 designates here the circuit resistance.

Figure 4:
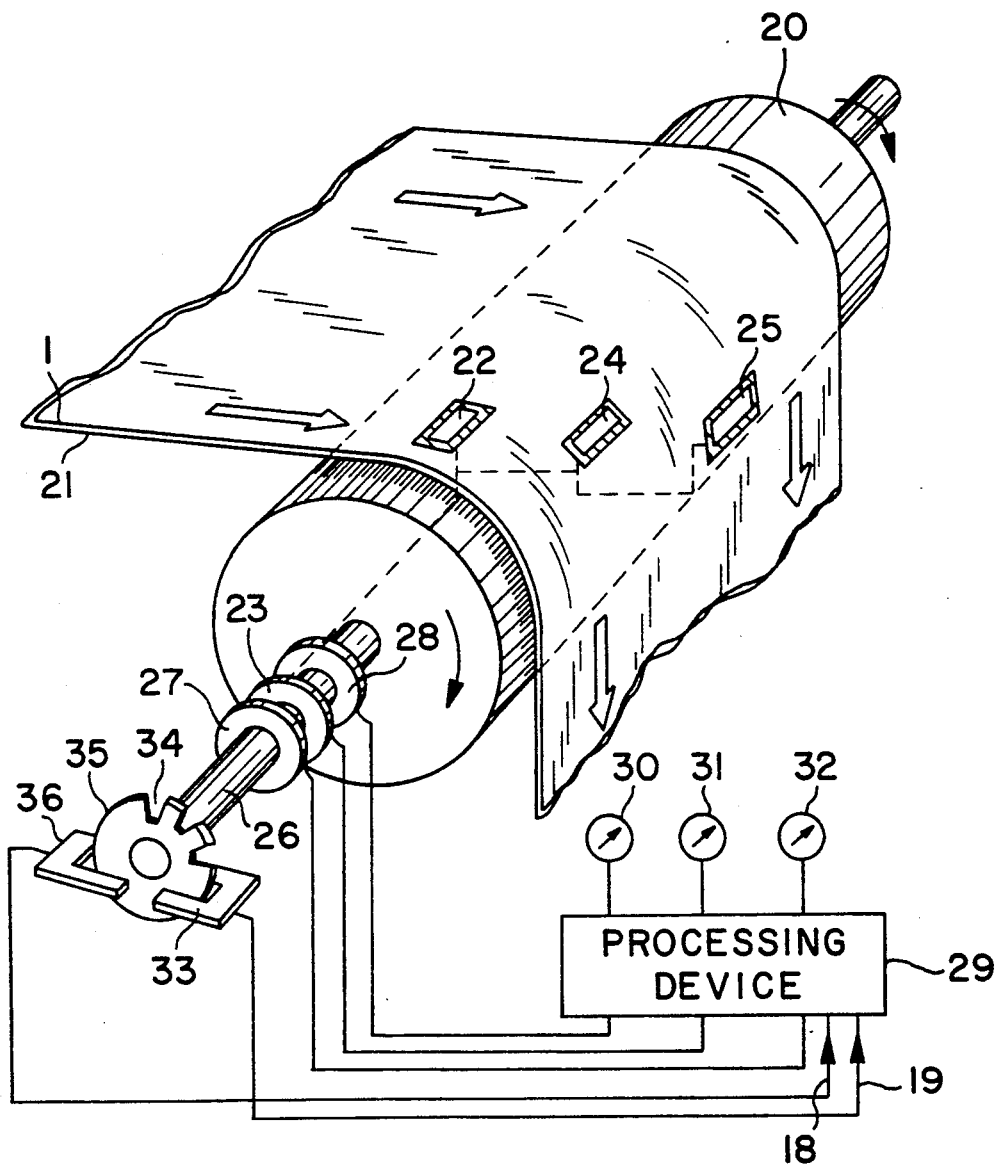
FIG. 4 shows apparatus in which the sensor according to the invention finds application.

FIG. 4 illustrates how the essential elements of the circuit arrangement according to FIG. 2 are disposed in an apparatus that has a measuring roller 20 rolling over a foil 21 carrying the thin layer 1 to be measured. Each of the sensors consisting of a coil 2 and the associated electronic components is embedded in the surface of the measuring roller 20, e.g. at sites 22, 24, 25. In this way it is assured that for one rotation of the roller 20 each sensor gives off one zero signal, namely when the foil does not lie on the coil, and one measurement signal, when the foil does lie on the coil.

The layer 1 to be measured on the foil 21 is disposed at an accurately reproducible distance from the coil 2, which distance is made up of the cover of e.g. 2 mm of the sensor added to the thickness of the carrier foil 21. In this way, the influence of a possible deviation of the thickness of the foil 21 from a constant thickness of 2 mm may be neglected.

Position detectors 33, 36 are mounted on a shaft 26 of the measuring roller 20 and are effective to connect the zero signal $U_{1(0)}$ to $U_{3(0)}$ in the analysing circuit, and the measurement signal $U_1$ to $U_3$ to two stores. The difference of the two signals $U_{R(0)}$ is, as already mentioned above, a voltage which is dependent only on the properties of the layer and proportional to the conductivity of the layer. In this way zero drift is eliminated, which for sensors of this type is often a thousand times greater than the measurement signal. This is especially favourable when applied in vacuum plants, where mostly the process chamber must not be opened for several hours.

The pick-off of the voltages $U_1$ to $U_3$ takes place via slip rings 23, 27, 28 seated on the shaft 26. These voltages are fed to a processing device 29 and displayed by indicating devices 30, 31, 32. The indicating devices may here be 10-volt pointer instruments, wherein e.g. a deflection of 1 V ≙ 100Ω□ and 10 V ≙ 10Ω□. The results are also passed to a non-illustrated plant computer which also computes the Ω□ values and represents them in a plant chart on a monitor screen. Commercially available inductive, capacitative or optical sensors 33, 36 may be used to detect the angular positions of the shaft 26, a disc 35 provided with cut-outs 34 rotating through the sensors which supply synchronization pulses 18, 19 to the processing device 29. The sensor 33 delivers here e.g. the times for the measurement processes I, II, III, while the sensor 36 delivers the timings for the zeroing processes I, II, III.

Figure 5:
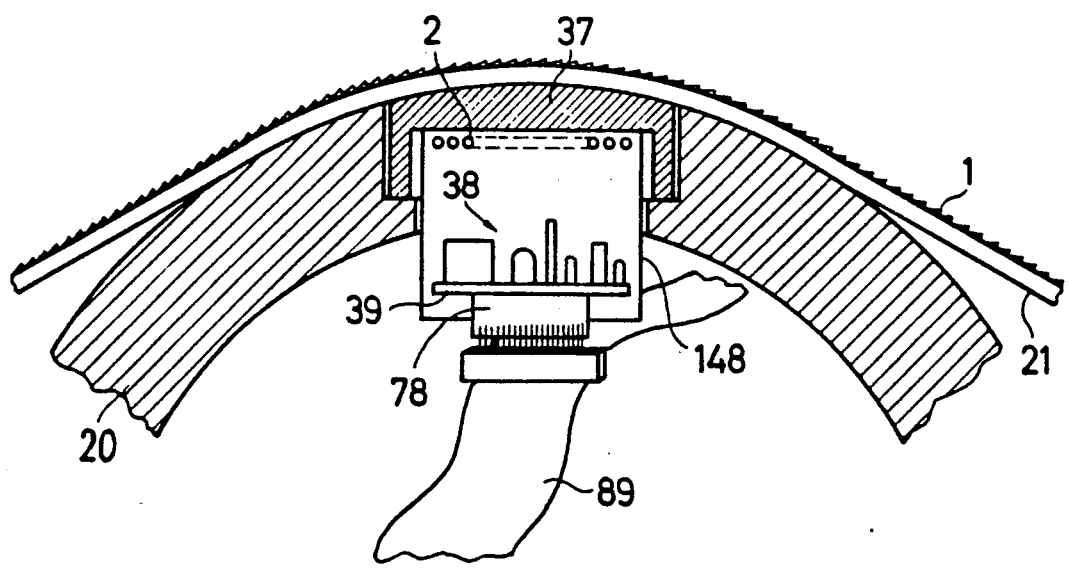
FIG. 5 shows an inductive sensor in the apparatus according to FIG. 4, on an enlarged scale.
Figure 6:
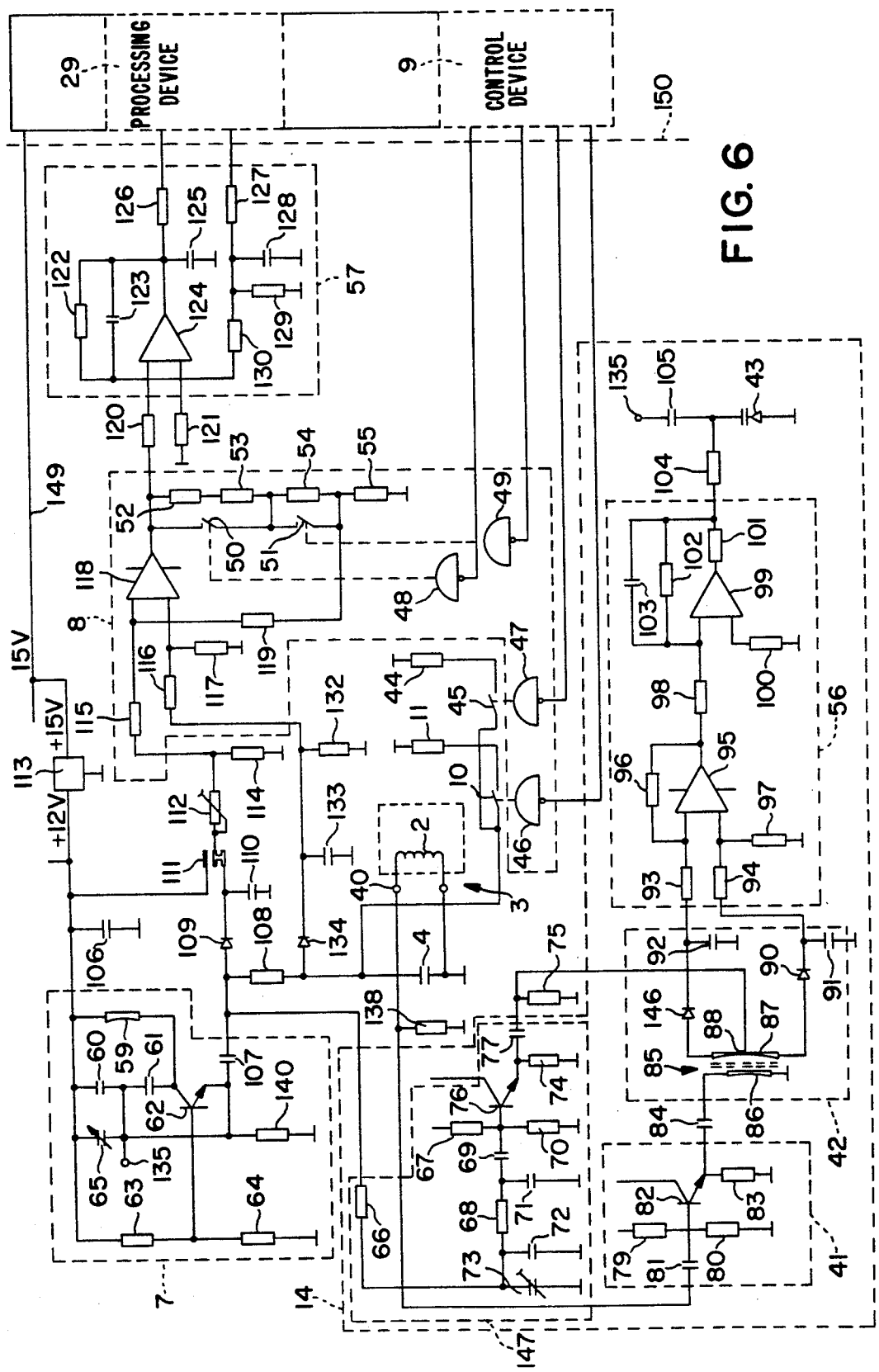
FIG. 6 is a detailed circuit diagram for the measurement of a resistance according to the eddy-current principle.

FIG. 5 illustrates a sensor according to the invention on an enlarged scale. Here the coil 2 is disposed directly beneath a cover 37 of an approximate thickness of 2 mm. The electronic circuit arrangement connected to the coil 2 and described in greater detail in FIG. 6 is disposed on a circuit board 39 connected via a connector 78 to a 20-conductor flat ribbon cable 89. The current supply and remote control take place through this ribbon cable 89.

FIG. 6 illustrates in detail a circuit arrangement showing the whole of the electronics of a sensor together with analysing circuits 9, 29. To the left of a dividing line 150 are the electronics 38 of the sensor, while to the right of this line a slip ring transformer (not shown) and the control/analysing circuits 9, 29 are shown.

The tapping 40 of the coil 2 is passed to a preamplifier 41 to which a matching transformer 42 is connected. The output voltages of this matching transformer 42 are fed to the amplifier 56 which amplifies the output signal of transformer 42 by a factor of 1000. The thus amplified signal is fed to a variable capacitance diode (varactor) 43 which regulates the frequency of the oscillator 7 via the capacitor 105 to the resonant frequency of the tuned circuit of the sensor. The terminal 135 of the capacitor 105 is connected for this purpose with the capacitor 65 of the oscillator 7.

The capacitor 4 and a resistor 138 are connected in parallel to the coil 2, while calibrating resistors 11, 44 are connectable via switches 10, 45 in parallel with the coil 2 and the capacitor 4. The switches 10, 45 are here controlled via inverting gates 46, 47 by the control device 9. From this control device 9 are two gates 48, 49 also driven to actuate switches 50, 51 for short-circuiting resistors 52, 53, 54. The inverters 46 to 49 together with switches 50, 51 contain commercially available circuit components. In this way it is rendered possible stepwise to adjust the gain of the preamplifier 8 to which the rectified current signal of the parallel resonant circuit 3 is fed. The output signal of the preamplifier 8 is passed via a voltage-to-voltage coverter 57 and a slip-ring transmitter 23, 27, 28 (FIG. 4) to the analysing device 29 and from there to a display device. The oscillator 7, the output voltage of which is fed to the coil 2, contains an inductor 59 to which to capacitors 60, 61 are connected in parallel while a transistor 62 is in series with the coil 59 and the two capacitors 60, 61. A variable capacitor 65, connected to a resistor 140 and the emitter of the transistor 62, is in parallel with the capacitor 60. The base of the transistor 62 is connected to a voltage divider having two resistors 63, 64 and being in parallel with a capacitor 106.

A connection between the emitter of the transistor 62 and the resonant circuit 3 is made through a capacitor 107 and a resistor 108. Additionally, a connection from this emitter leads via a resistor 66 to a phase-correcting arrangement 14 that has a 90° phase-shifter 147 consisting of four capacitors 72, 73, 71, 69 and two resistors 66, 68. The resistor 70 together with a further resistor 67 here forms a voltage divider for the base of a transistor 76 the emitter of which is connected to an RC-circuit 74, 77.

The parallel-tuned circuit 3 is also connected to preamplifier 41 containing a transistor 82 coupled to three resistors 79, 80, 83 and a capacitor 81. The output signal of this preamplifier 41 is fed via a capacitor 84 to the primary winding 86 of a transformer 85 the secondary winding 87 of which has a central tap 88. A connection via a resistor 75 leads to this central tap from the capacitor 77 of the phase-correction arrangement 14. The total voltage at the secondary 87 is fed, after rectification by diodes 146, 90 and smoothing by capacitors 91, 92, via resistors 93, 94 to the first stage of a two-stage amplifier 56, the first stage consisting of an operational amplifier 95 connected to two resistors 96, 97. The output voltage of the operational amplifier 95 is connected via a resistor 98 to one input of a second operational amplifier 99, the second input is grounded via a resistor 100. In the feedback loop of this operational amplifier 99 there is a parallel circuit consisting of a resistor 102 and a capacitor 103. The output signal of the operational amplifier 99 is connected through resistors 101, 104 to the cathode of the variable capacitance diode 43 as well as to a capacitor 105 connected with the capacitor 65 of the oscillator.

The current $i_1$ flowing in the parallel resonant circuit 3 produces a voltage at the resistor 108 which is rectified by diodes 109, 134, smoothed by the capacitors 110, 133 and fed via a contact member 111 and via resistors 112, 115, 116 to the preamplifier 8 which proportionally amplifies the voltage. A grounded resistor 114 is connected to the junction of resistors 112, 115. The resistor 116 is also grounded via a further resistor 117. A connection from one input of the preamplifier 8 leads over a resistor 119 to a voltage divider 54, 55. The preamplifier 8 contains an operational amplifier 124 in the feedback loop of which are a resistor 122 and a capacitor 123 connected in parallel. The inputs of this operational amplifier 124 are connected to resistors 120, 121 of which resistor 120 is coupled to the output of the operational amplifier 118 and resistor 121 is grounded. The feedback 122, 123 of operational amplifier 124 is connected via a resistor 130, an RC circuit 129, 128 and an inductor 127 to the analysing circuit 29. The voltage amplified by the preamplifier 8 is fed to a voltage-to-current converter 57 which controls a display unit via slip rings (FIG. 4) and analysing circuit 29. The inductors 126, 127 of the converter 57 take care that no high frequency is forced outwardly from the sensor and that the sensor cannot be disturbed by an external high frequency.

The output voltage of the preamplifier 8 may be varied by connecting or disconnecting various resistors 52 to 55 of operational amplifier 118.

Element 113 is a 12 Volt stabiliser which compensates for voltage fluctuations coming e.g. from the current supply line 149.

A measurement process by means of the described apparatus occurs, for example, by first adjusting the oscillating circuit 3 to resonance. If one now assumes that just then no layer 1 to be measured is disposed above the inductor 2, then the detector 36 gives a zeroing signal 18 to the analysing circuit 29. Let the frequency of the voltage $U_{1(0)}$ at this point in time the 1800 KHz. This voltage value is stored in a store of the controlling and analysing circuit 9. On rotation of the roller 20 as the inductor 2 nears the layer 1 to be measured, all the reactive components in the oscillating circuit 3 are compensated with a time constant of a few thousandths of a second. When the layer 1 to be measured is directly over the inductor 2, the position detector 33 gives a 'measure' signal 19 to the analysing circuit 29. The voltage $U_1$, now of 1820 KHz frequency, is stored in analysing circuit 29. The difference $U_1 - U_{1(0)}$ is now formed, which is proportional to the surface conductance or to the reciprocal surface resistance (1 R□).

I claim:

1. An apparatus for the non-destructive measurement of the ohmic resistance of thin layers according to the Eddy Current Principle, wherein an inductor is fed with alternating current with the magnetic field of which produces an Eddy Current in the thin layers, the magnetic field of which opposes the original magnetic field of the inductor, and wherein the inductor with a capacitor forms an oscillating circuit (3) and a means for keeping the oscillating circuit always at resonance is provided, said means for keeping said oscillator always at resonance comprising a phase regulation means and further characterized in that the inductor (2) has a cover (37) and is so embedded in a roller (20) that a surface of the cover (37) is flushed with the surface of the roller (20), while the thin layer (1) to be measured is displaceable on a carrier foil (21) over the roller (20), a means for maintaining the thin layer at a constant distance from said inductor is provided, an amplifier (8) is provided to amplify the current ($i_1$) flowing to the oscillating circuit (3), a voltage-to-current converter (57) is connected in series with the amplifier (8) and the gain of the amplifier (8) is stepwise switchable via several resistors (52-55).

2. An apparatus for the non-destructive measurement of the ohmic resistance of thin layers according to the Eddy Current Principle, wherein an inductor is fed with alternating current with the magnetic field of which produces an Eddy Current in the thin layers, the magnetic field of which opposes the original magnetic field of the inductor, and wherein the inductor with a capacitor forms an oscillating circuit (3) and a means for keeping the oscillating circuit always at resonance is provided, said means for keeping said oscillator always at resonance comprising a phase regulation means and further characterized in that the inductor (2) has a cover (37) and is so embedded in a roller (20) that a surface of the cover (37) is flushed with the surface of the roller (20), while the thin layer (1) to be measured is displaceable on a carrier foil (21) over the roller (20), a means for maintaining the thin layer at a constant distance from said inductor is provided and two memory means are provided of which one memory means stores a zero signal and the other memory means stores a measurement signal, and that the difference between the two signals serves as a measurement of the resistance of the thin layer (1) to be measured.

3. An apparatus for the non-destructive measurement of the ohmic resistance of thin layers according to the Eddy Current Principle, wherein an inductor is fed with alternating current with the magnetic field of which produces an Eddy Current in the thin layers, the magnetic field of which opposes the original magnetic field of the inductor, and wherein the inductor with a capacitor forms an oscillating circuit (3) and a means for keeping the oscillating circuit always at resonance is provided, said means for keeping said oscillator always at resonance comprising a phase regulation means and further characterized in that the inductor (2) has a cover (37) and is so embedded in a roller (20) that a surface of the cover (37) is flushed with the surface of the roller (20), while the thin layer (1) to be measured is displaceable on a carrier foil (21) over the roller (20), a means for maintaining the thin layer at a constant distance from said inductor is provided, a resistor of a known value which is selectively connectable to the oscillating circuit (3) for calibrating said apparatus is provided, a position sensor is provided and calibration takes place when the position sensor delivers a zero signal.

4. An apparatus for non-destructive measurement of the ohmic resistance of thin layers according to the eddy current-principle, said apparatus comprising:
a high frequency generator;
an oscillating circuit comprising at least an inductor and a capacitor, said inductor circuit being connected to said high-frequency generator, the inductor and oscillating circuit being provided in a vicinity of said thin layers and in a roller at certain time intervals when the roller is turning;
means for continuously causing the frequency of the high-frequency generator and the resonant frequency of the oscillating circuit to be equal;

a cover provided on said inductor, the surface of the cover being flush with a surface of said roller;

a carrier foil provided over the roller with the thin layer displaceably provided thereon;

a first means for storing a signal when the inductor is not in the vicinity of the thin layers; and a second means for storing a signal when the inductor is in the vicinity of the thin layers;

whereby said ohmic resistance of said thin layers is determined from said signals stored in said first and second means.

5. A non-destructive process for measuring the ohmic resistance of thin layers utilizing eddy currents, said process comprising the steps of:

providing the oscillating circuit comprising at least an inductor and a capacitor in the vicinity of the thin layer;

applying a high frequency signal to said oscillating circuit;

continuously causing the frequency of the high frequency signal and a resonant frequency of the oscillating circuit to be equal;

providing a carrier foil of which the thin layer to be measured is displaceable;

storing a signal from the oscillating circuit when the inductor is in the vicinity of the thin layers in a first storing means; and storing a signal from the oscillating circuit when the inductor is not in the vicinity of the thin layers in a second storing means;

whereby the ohmic resistance of the thin layer is determined from said storing signals in said first and second storing means.

6. An apparatus for the non-destructive measurement of the ohmic resistance of a thin layer, comprising:

an electrically conductive thin layer (1) having an ohmic resistance and being displaceably arranged over a roller (20) so that a part of the circumferential surface of said roller (20) is in the close vicinity of said thin layer (1);

an inductor (2) generating a magnetic field, said magnetic field penetrating into said conductive thin layer (1);

a high frequency generator (7);

capacitive means (4) establishing together with said inductor (2) an oscillating circuit (3), said oscillating circuit (3) being connected to said high frequency generator (7);

means (14) for continuously causing the frequency of the high-frequency generator (7) and the resonant frequency of the oscillating circuit (3) to be equal;

a cover (37) provided on said inductor (2), the surface of the cover being flush with a surface of said roller (20);

first means for storing a measuring signal from said oscillating circuit (3) when the inductor (2) is in the vicinity of said thin layer (1);

a second means for storing a zero signal from said oscillating circuit (1) when the inductor (2) is not in the vicinity of said thin layer (1); and means for determining the ohmic resistance of said thin layer (1) by evaluating said measuring signal and said zero signal.

7. An apparatus according to claim 6, wherein the thin layer (1) to be measured is vapour-deposited on a carrier foil (21) over the roller (20).

8. An apparatus according to claim 6, wherein the inductor (2) is connected to an electronic circuit (38) disposed on a circuit board (39) within a housing (148) which is connected by way of plug-in contacts (78) with a flat ribbon cable (89).

9. An apparatus according to claim 6, wherein said means for continuously causing the frequency of the high-frequency generator (7) and the resonant frequency of the oscillating circuit (3) to be equal corrects the frequency of the alternating current ($i_1$) feeding said oscillating circuit (3).

10. An apparatus according to claim 9, wherein the frequency of the alternating current ($i_1$) is adjusted to the instantaneous frequency of the oscillating circuit (3) by a phase-correcting arrangement (14).

11. An apparatus according to claim 6, wherein the oscillating circuit (3) is a parallel resonant circuit.

12. An apparatus according to claim 11, wherein the oscillating circuit (3) contains at least said inductor (2) and said capacitor means (4).

13. An apparatus according to claim 3, wherein a resistor (11) is connectable to said inductor (2) and said capacitor means (4).

14. An apparatus according to claim 13, wherein the resistor (11) is remotely connectable.

15. An apparatus according to claim 6, wherein an amplifier (8) is provided to amplify the current ($i_1$) flowing to the oscillating circuit (3).

16. An apparatus according to claim 15, wherein a voltage-to-current-converter (57) is connected in series with the amplifier (8).

17. An apparatus according to claim 16, wherein the gain of the amplifier (8) is stepwise switchable via a plurality of selectable resistors (52–55).

18. An apparatus according to claim 10, wherein the oscillating circuit (3) is connected to a preamplifier (41) that supplies a transformer (42) a secondary winding of which has a central tap (88) connected to a 90° phase-shifter (147) and an output of the 90° phase shifter (147) being coupled to the high frequency generator (7).

19. An apparatus according to claim 10, wherein the phase-connecting arrangement (14) comprises a preamplifier (41) coupled to the inductor (2), a transformer (42) coupled to the preamplifier (41), an amplifier (56) coupled to the transformer (42), a variable capacitance diode (43) coupled to the amplifier (56), and a resistor (104) and a capacitor (105) coupled to said amplifier (56) with the capacitor (105) also coupled to said high-frequency generator (7).

20. An apparatus according to claim 16, wherein said resistor (11) is selectively connectable to the oscillating circuit (3) for calibrating said apparatus.

21. An apparatus according to claim 2, wherein a position sensor is provided and the calibration takes place when the position sensor delivers a zero signal.

22. An apparatus according to claim 20, wherein for calibration purposes the thin layer (1) is formed of a material of known surface resistance.

* * * * *